United States Patent [19]

Bapat et al.

(10) Patent No.: US 7,227,390 B1
(45) Date of Patent: Jun. 5, 2007

(54) APPARATUS AND METHOD FOR A DRIVER WITH AN ADAPTIVE DRIVE STRENGTH FOR A CLASS D AMPLIFIER

(75) Inventors: Sumant Bapat, Santa Clara, CA (US); Ansuya P. Bhatt, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 24 days.

(21) Appl. No.: 11/043,797

(22) Filed: Jan. 25, 2005

(51) Int. Cl.
*H03K 3/00* (2006.01)

(52) U.S. Cl. .................. 327/108; 326/82; 326/83; 326/91; 327/80; 327/81

(58) Field of Classification Search .............. 327/77, 327/78, 80, 81, 108–112
See application file for complete search history.

(56) References Cited

U.S. PATENT DOCUMENTS

| 5,424,721 A | * | 6/1995 | Asai | 340/636.15 |
| 5,689,202 A | * | 11/1997 | Ranson | 327/142 |
| 5,742,148 A | * | 4/1998 | Sudo et al. | 320/134 |
| 5,894,423 A | * | 4/1999 | Ling et al. | 700/293 |
| 5,961,542 A | * | 10/1999 | Agarwala | 607/63 |
| 6,633,186 B1 | * | 10/2003 | Bazes | 327/159 |
| 6,917,226 B2 | * | 7/2005 | Brown | 327/110 |

* cited by examiner

*Primary Examiner*—Tuan T. Lam
*Assistant Examiner*—Hiep Nguyen
(74) *Attorney, Agent, or Firm*—Darby & Darby PC; Matthew M. Gaffney (57) ABSTRACT

A circuit for adaptively adjusting the drive strength of output power transistors in a class D amplifier is provided. The circuit includes a driver circuit and a low-voltage detect circuit. The low-voltage detect circuit is arranged to assert a low-voltage detect signal if a low supply voltage condition is detected. The driver circuit is arranged to increase the drive strength if the low-voltage detect signal is asserted. The driver circuit includes a first driver and a second driver. The second driver is enabled if the low-voltage detect signal is asserted, and disabled if the low-voltage detect signal is unasserted.

16 Claims, 8 Drawing Sheets

APPARATUS AND METHOD FOR A DRIVER WITH AN ADAPTIVE DRIVE STRENGTH FOR A CLASS D AMPLIFIER

FIELD OF THE INVENTION

The invention is related to driver circuits, and in particular, to a circuit for a driving power devices where the drive strength is compensated based on changes in the supply voltage.

BACKGROUND OF THE INVENTION

In audio applications, a speaker may be driven by an amplifier, typically a class AB amplifier. However, class AB amplifiers have low power efficiency. In portable applications, such as cell phones, personal desktop assistants (PDAs), and headphone amplifiers, battery life can be a significant concern. Also, in high-power systems, (e.g. 5 W–300 W), metal heat sinks are typically required because the low efficiency of Class AB amplifiers.

Compared to class AB amplifiers, class D amplifiers have much higher efficiency. A class D architecture could significantly increase the battery life in portable systems, and could allow multi-channel high-power systems to be designed very light and compact by eliminating the heat sinks that are typically employed.

Class D amplifiers typically employ either pulse width modulation or sigma-delta modulation. After initial conditioning of the audio signal, the signal is typically modulated by a high-frequency carrier signal. Also, the output stage of a class D amplifier is typically a pair of power MOSFETs which operate as switches to couple the output to VDD or ground based on the modulated signal. The output is generally low-pass filtered and provided to a speaker or a headphone for audio applications.

BRIEF DESCRIPTION OF THE DRAWINGS

Non-limiting and non-exhaustive embodiments of the present invention are described with reference to the following drawings, in which.

DETAILED DESCRIPTION

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" includes plural reference, and the meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal. Where either a field effect transistor (FET) or a bipolar junction transistor (BJT) may be employed as an embodiment of a transistor, the scope of the words "gate", "drain", and "source" includes "base", "collector", and "emitter", respectively, and vice versa.

Briefly stated, the invention is related to a circuit for adaptively adjusting the drive strength for driving output power devices of a class D amplifier. The circuit includes a driver circuit and a low-voltage detect circuit. In one embodiment, the low-voltage detect circuit is arranged to assert a low-voltage detect signal if a low supply voltage condition is detected. The driver circuit is arranged to increase the drive strength if the low supply voltage condition is detected. In one embodiment, the driver circuit includes a first driver and a second driver. In this embodiment, the second driver is enabled if the low-voltage detect signal is asserted, and disabled if the low-voltage detect signal is unasserted.

Figure 1:
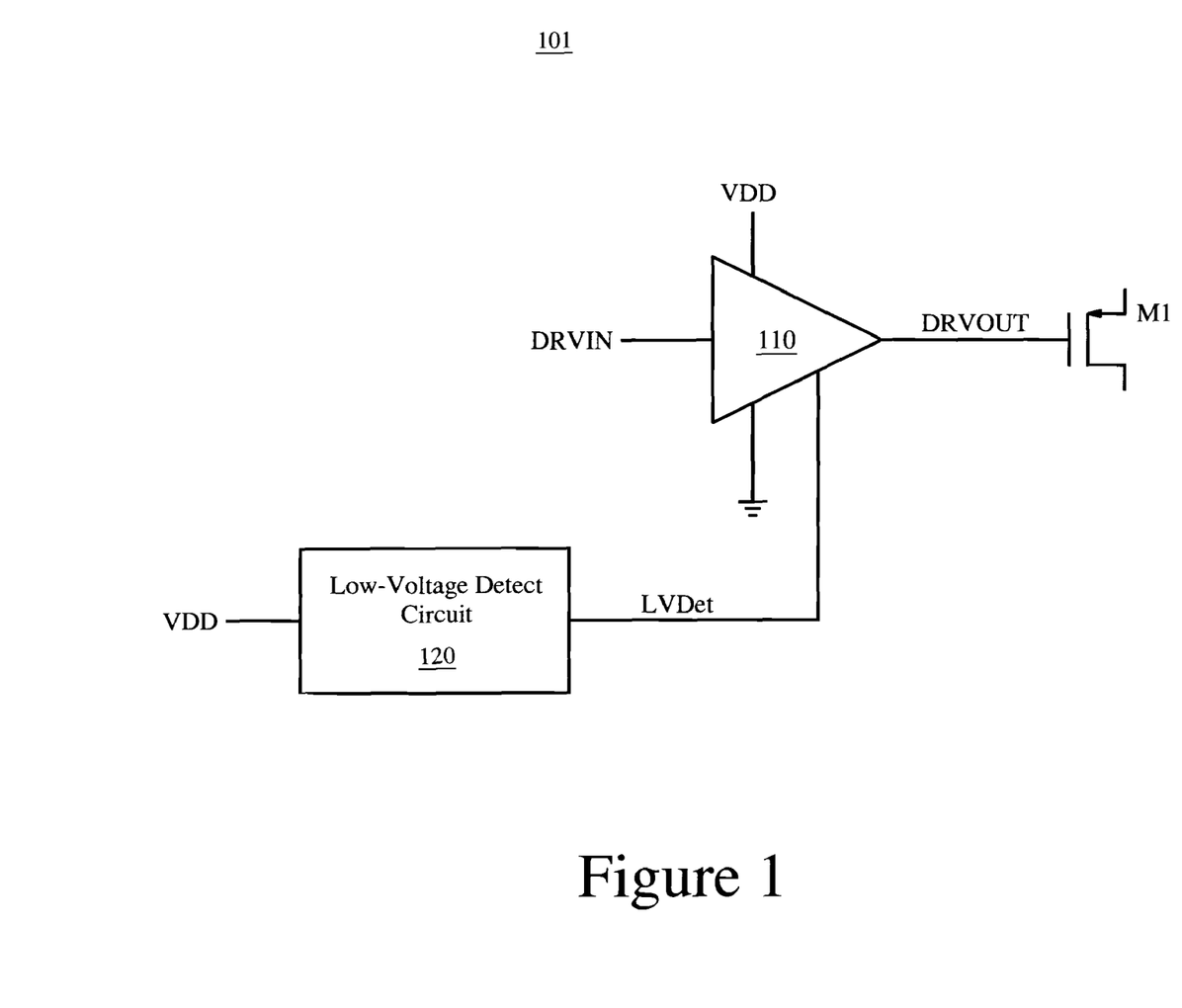
FIG. 1 illustrates a block diagram of an embodiment of a circuit.

FIG. 1 illustrates a block diagram of an embodiment of circuit 101. Circuit 101 includes driver circuit 110 and low-voltage detect circuit 120.

In operation, low-voltage detect circuit 120 is arranged to monitor power supply voltage VDD, and to determine whether a low supply voltage condition has occurred based on the monitoring. Further, low-voltage detect circuit 120 is arranged to adjust low-voltage detect signal LVDet based, at least in part, on whether the low supply voltage condition is detected.

Driver circuit 110 is arranged to drive power transistor M1 by providing driver output signal DRVOUT responsive to signal DRVIN. Also, driver circuit 110 is configured to operate between two power supply rails, e.g. between power supply signal VDD and ground or between VDD and VSS, so that signal DRVOUT is based in part on power supply voltage VDD. Further, driver circuit 110 is arranged to, based on signal LVDet, increase a drive strength associated with driver circuit 110 if the low supply voltage condition has been detected.

In one embodiment, low-voltage detect circuit 120 is arranged to provide signal LVDet as one signal that is asserted if the low supply voltage condition is detected, and unasserted if the low supply voltage condition is not detected. In another embodiment, signal LVDet may include two or more signals for indicating whether two or more low supply voltage conditions have been detected. For example, in one embodiment, low-voltage circuit 120 detects whether supply voltage VDD is below 3.4V, and also detects whether supply voltage VDD is below 2.0V. In this embodiment, the first signal of signal LVDet is asserted if voltage VDD is below 3.4 V, and the second signal of signal LVDet is asserted if voltage VDD is below 2.0V. In this embodiment, driver circuit 110 may be arranged such that the drive strength of driver circuit 110 is increased if voltage VDD falls below 3.4V, and such that the drive strength of driver circuit 110 increases further if voltage VDD falls below 2.0V. In other embodiments, even finer voltage distinctions may be employed, and driver circuit 110 may be arranged to respond accordingly. In other embodiments, only one voltage distinction may be employed, and driver circuit 110 may be arranged to respond accordingly.

In any case, low-voltage detect circuit 120 is arranged to provide signal LVDet based on signal VDD, and driver circuit 110 is arranged to adaptively adjust its drive strength responsive to signal LVDet. In one embodiment, signal LVDet is one signal having two logic levels, and signal LVDet is asserted substantially if voltage VDD is below a low supply voltage threshold, and unasserted substantially if voltage VDD is above the low supply voltage threshold. In this embodiment, driver circuit 110 is arranged to increase its drive strength if signal LVDet is asserted. In other embodiments, as previously discussed, finer voltage distinctions may be employed.

The phrase "substantially if" is used herein throughout the specification and the claims because in various embodiments, hysteresis, de-glitch counting, and/or the like, may be employed. In one embodiment, determining if voltage VDD is below the low supply voltage threshold employs both hysteresis and de-glitch counting. In another embodiment, determining if voltage VDD is below the low supply voltage threshold employs hysteresis but not de-glitch counting. In yet another embodiment, determining if voltage VDD is below the low supply voltage threshold employs de-glitch counting but not hysteresis. In still another embodiment, determining if voltage VDD is below the low supply voltage threshold employs neither hysteresis nor de-glitch counting, and may or may not include other techniques similar to hysteresis and de-glitch counting for reducing glitches, noise, and/or other spurious effects. The scope of the phrase "determining substantially if the supply voltage is below" includes each of these embodiments, and the like.

Circuit 101 may be employed to keep the drive strength of drive circuit 110 approximately the same across a wide supply voltage range. By increasing the drive strength if supply voltage VDD falls, the decrease in supply voltage VDD may be approximately compensated for. Accordingly, the amount of non-overlap, and other timing parameters, for signal DRVOUT may be approximately unaffected by changes in supply voltage VDD. Although ideally, as a result of the adaptive drive strength, no change should occur as a result of changes in supply voltage VDD, in practice, some changes may occur as a result of changes in supply voltage VDD. However, circuit 101 may be arranged such that changes in supply voltage VDD are sufficiently compensated for so that performance is not significantly affected.

In one embodiment, circuit 101 may be employed in circuits that employ batteries as a power source. As the battery voltage falls over time, the drive strength may be increased to compensate. If the battery is re-charged, the drive strength may be returned to its normal level.

Circuit 101 may be implemented to drive virtually any power device, or the like. In one embodiment, circuit 101 may be employed as a portion of a class D power amplifier. However, the scope of the invention is not so limited, and circuit 101 may be employed in other applications. Embodiments of the invention may be employed for power devices other than class D amplifiers, for class D amplifiers that employ pulse width modulation, for class D amplifiers that employ sigma-delta modulation, for any method suitable for class D amplification, and the like.

Figure 2:
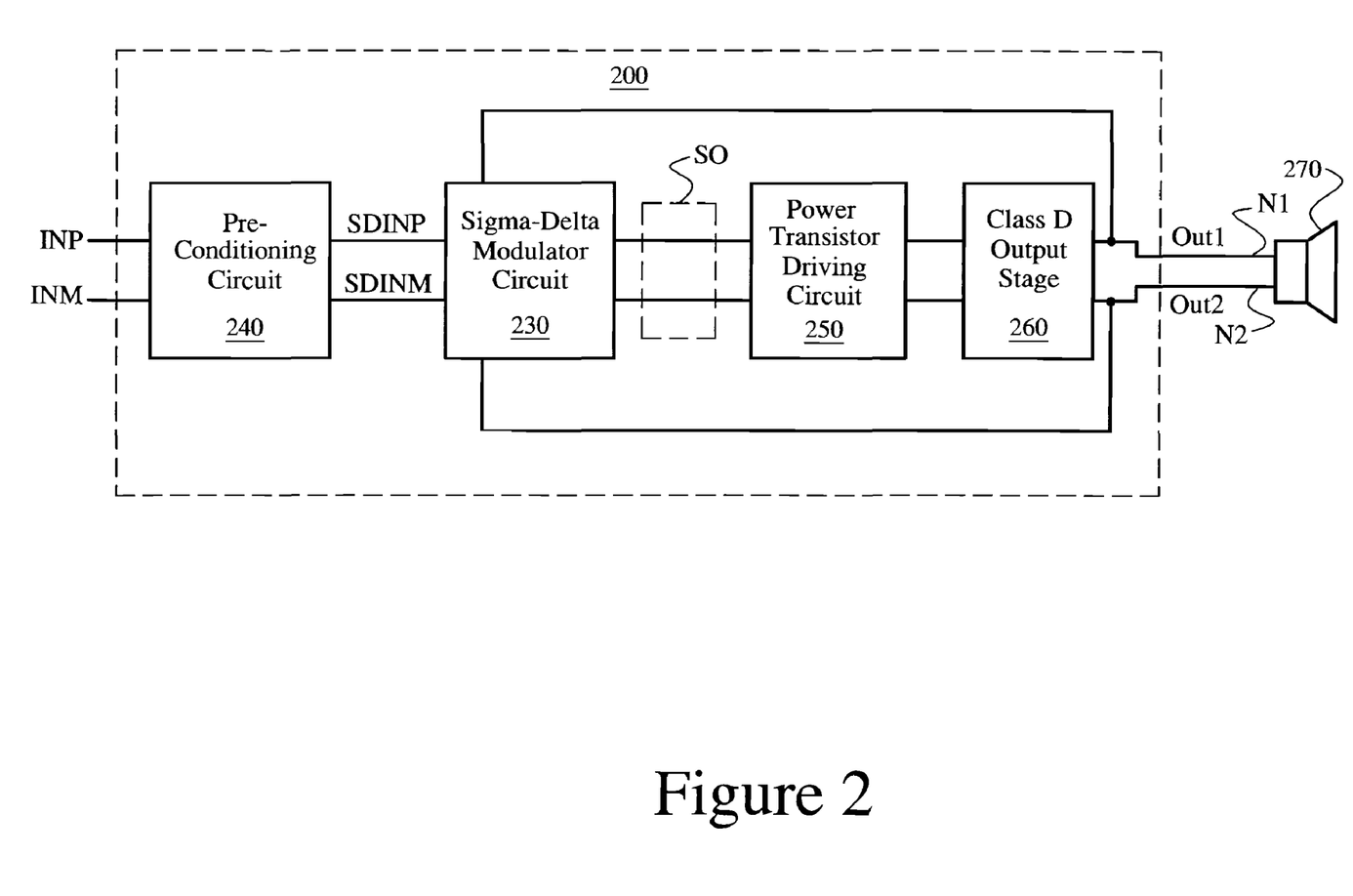
FIG. 2 shows a block diagram of an embodiment of a class D amplifier that may be employed as an embodiment of the circuit of FIG. 1, and a speaker.

FIG. 2 shows a block diagram of an embodiment of class D amplifier 200 and speaker 270. Class D amplifier 200 may include an embodiment of circuit 101 of FIG. 1. Class D amplifier 200 includes pre-conditioning circuit 240, sigma-delta modulator circuit 230, power transistor driving circuit 250, and class D output stage 260.

In operation, pre-conditioning circuit 240 provides sigma-delta modulator input signal SDIN from audio input signal IN. In one embodiment, as illustrated in FIG. 2, sigma-delta modulator output signal SDIN is a differential signal that includes signals SDINP and SDINM, and signal IN is a differential signal including signals INP and INM.

Sigma-delta modulator circuit 230 is arranged to provide sigma-delta modulator output signal SO based on signal SDIN and signal OUT. In one embodiment, signal SO includes a plurality of driver input signals.

Power transistor driving circuit 250 is arranged to drive class D output stage 260 based on signal SO to provide output signal OUT. Class D output stage 260 includes an embodiment of power transistor M1 of FIG. 1.

In one embodiment, as illustrated in FIG. 2, class D amplifier 200 is arranged in a bridge-tied load configuration such that signal OUT includes two signals, OUT1 and OUT2. In one embodiment, speaker 270 operates as resistive load with a relatively small resistance, driven responsive to signal OUT.

Although differential signals are illustrated in FIG. 2, in other embodiments, some or all of the signals shown may be single-ended rather than differential. Similarly, although speaker 270 is shown in a bridge-tied load configuration in FIG. 2, in other embodiments, signals 270 may be arranged in a single-ended configuration.

Figure 3:
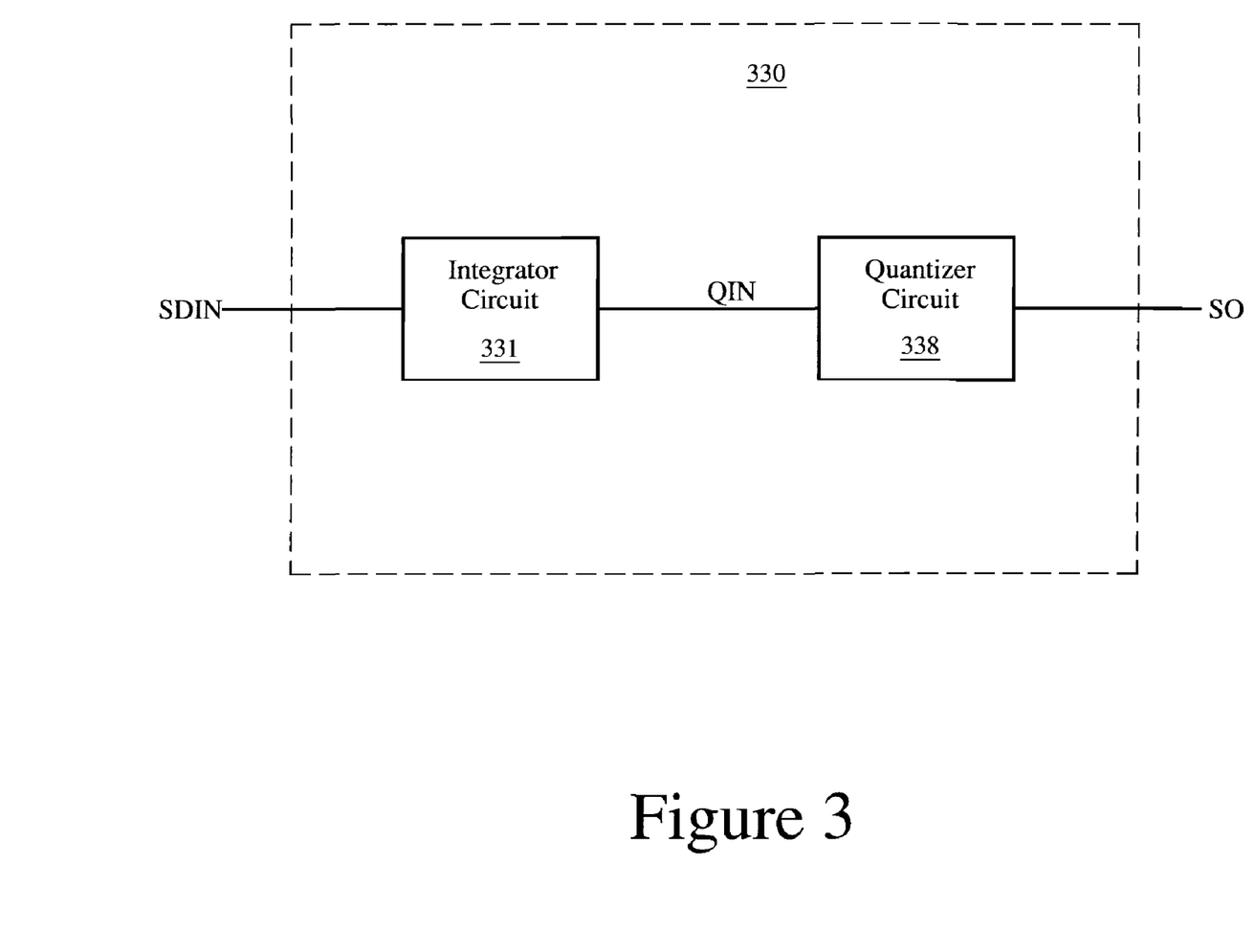
FIG. 3 illustrates a block diagram of an embodiment of the sigma-delta modulator circuit of FIG. 2.

FIG. 3 illustrates a block diagram of an embodiment of sigma-delta modulator circuit 330. Sigma-delta modulator circuit may be employed as an embodiment of sigma-delta modulator circuit 230 of FIG. 2. Sigma-delta modulator circuit 330 includes integrator circuit 331 and quantizer circuit 338.

In one embodiment, sigma-delta modulator circuit 330 has a differential architecture. In another embodiment, sigma-delta modulator circuit 330 has a single-ended architecture. Although a single-ended architecture is shown and described with reference to FIG. 3, differential architectures are also within the scope and spirit of the invention.

In one embodiment, integrator circuit 331 is arranged to provide quantizer input signal QIN from sigma-delta modulation input signal SDIN. In other embodiments, sigma-delta modulator circuit 330 may include more than one integrator circuit, which are arranged to provide sigma-delta modulation of higher than first order to provide quantizer input signal QIN. Quantizer circuit 338 is arranged to provide sigma-delta modulation output signal SO based on quantization input signal QIN. In one embodiment, quantization is accomplished by comparing signal QIN to a reference signal. In a differential embodiment of sigma-delta modulator circuit 330, quantizer input signal QIN may be a differential signal that includes signals QINP and QINM. In a single-ended embodiment, quantizer input signal QIN may be a single-ended signal.

Figure 4:
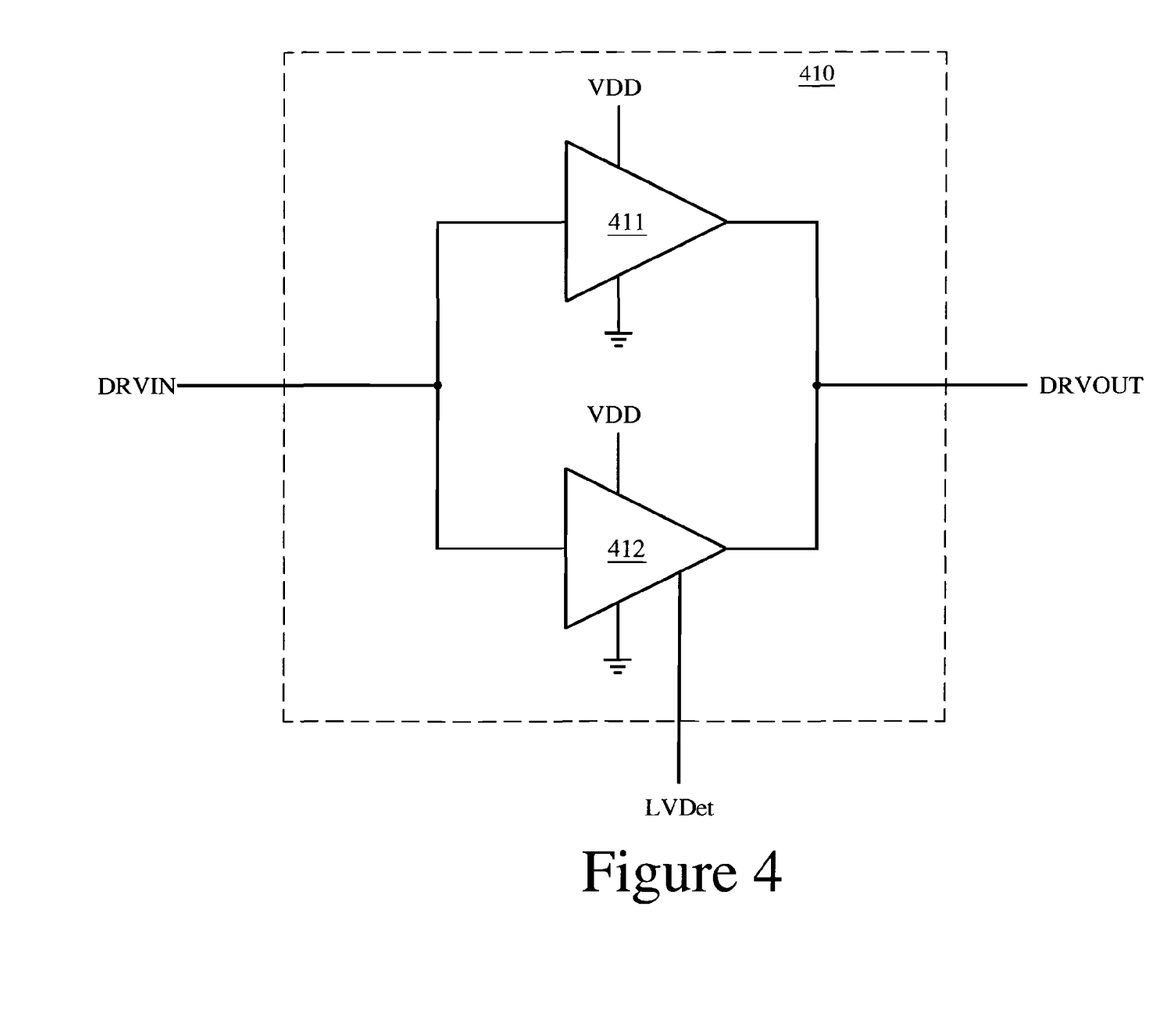
FIG. 4 illustrates a block diagram of an embodiment of the driver circuit of FIG. 1.

FIG. 4 illustrates a block diagram of an embodiment of driver circuit 410, which may be employed as an embodiment of driver circuit 110 of FIG. 1. Driver circuit 410 includes drivers 411 and 412. Driver 411 has an input that is coupled to an input of driver 412. Also, driver 411 has an output that is coupled to an output of driver 412. During normal operation, driver circuit 411 is enabled regardless of the logic level of signal LVDet. Driver 412 is arranged to be enabled when signal LVDet is asserted, and further arranged to be disabled if signal LVDet is unasserted. Accordingly, the drive strength of driver circuit 410 is increased if signal LVDet is asserted.

In one embodiment, driver circuit 410 includes two drivers. In other embodiments, driver circuit 410 may include more than two drivers. The additional drivers may be enabled or disabled responsive to signal LVDet for adjusting the drive strength of driver circuit 410 based on finer voltage distinctions in voltage VDD. In other embodiments, drive strength may be adjusted in other ways.

Figure 5:
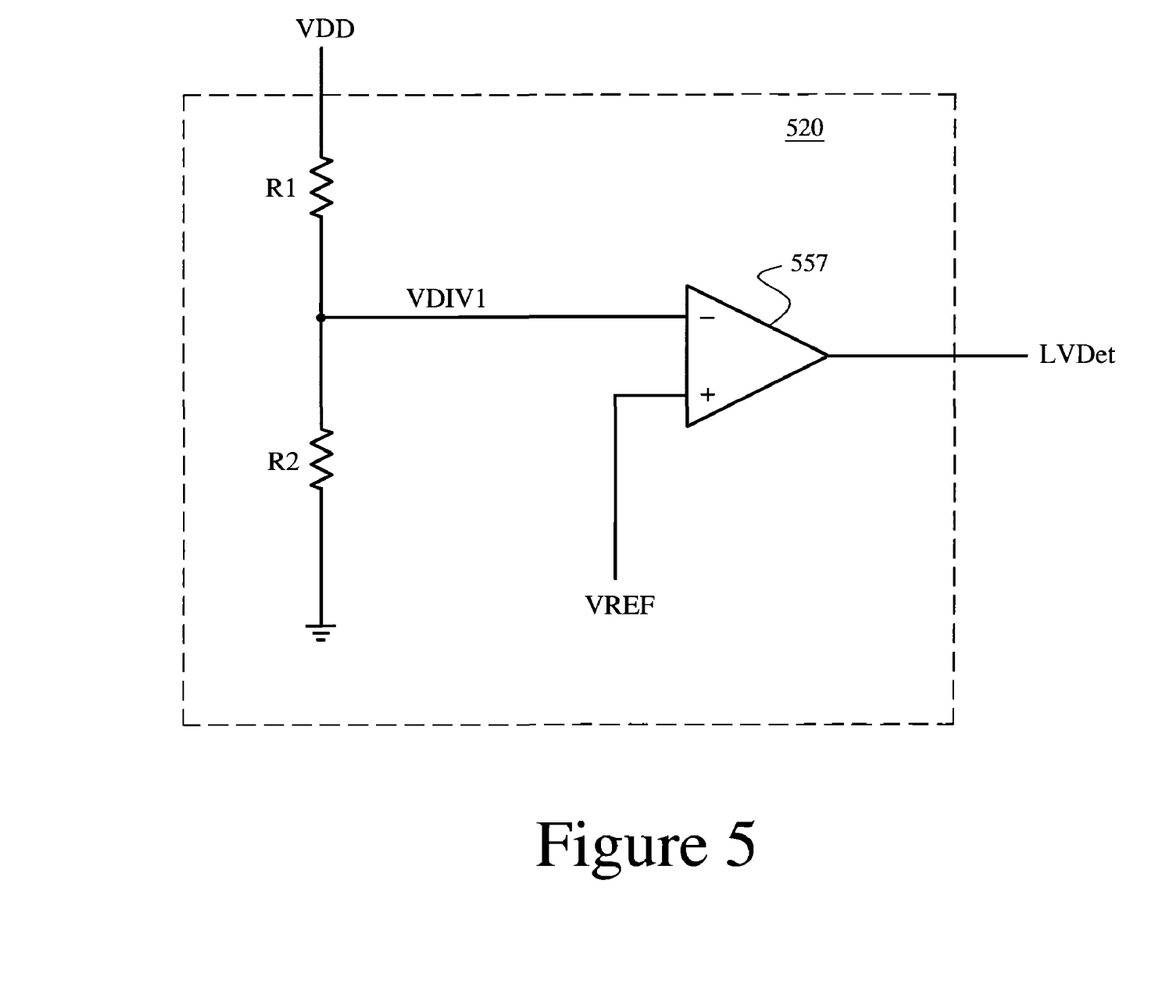
FIG. 5 shows a block diagram of an embodiment of the low-voltage detect circuit of FIG. 1.

FIG. 5 shows a block diagram of an embodiment of low-voltage detect circuit 520. Low-voltage detect circuit 520 may be employed as an embodiment of low-voltage detect circuit 120 of FIG. 1. Low-voltage detect circuit 520 may include resistors R1 and R2, and comparator 557.

Resistors R1 and R2 are arranged as a voltage divider to provide divided voltage VDIV1 from supply voltage VDD. Additionally, comparator 557 may be arranged to compare voltage VDIV1 with reference voltage VREF, and to provide signal LVDet based on the comparison. In one embodiment, the comparison includes hysteresis. In another embodiment, the comparison does not include hysteresis. In one embodiment, comparator 557 trips substantially if voltage VDD is below about 3.4V. In other embodiments, a voltage level other than 3.4V may be employed for the low-voltage detection.

In another embodiment, resistors R1 and R2 are not included in low-voltage detect circuit 520, and voltage VDD is compared directly to a reference voltage. Also, in yet another embodiment, low-voltage detect circuit 520 includes additional comparators for finer voltage distinctions of supply voltage VDD. In other embodiments, the voltage distinction may be implemented in other ways.

Figure 6:
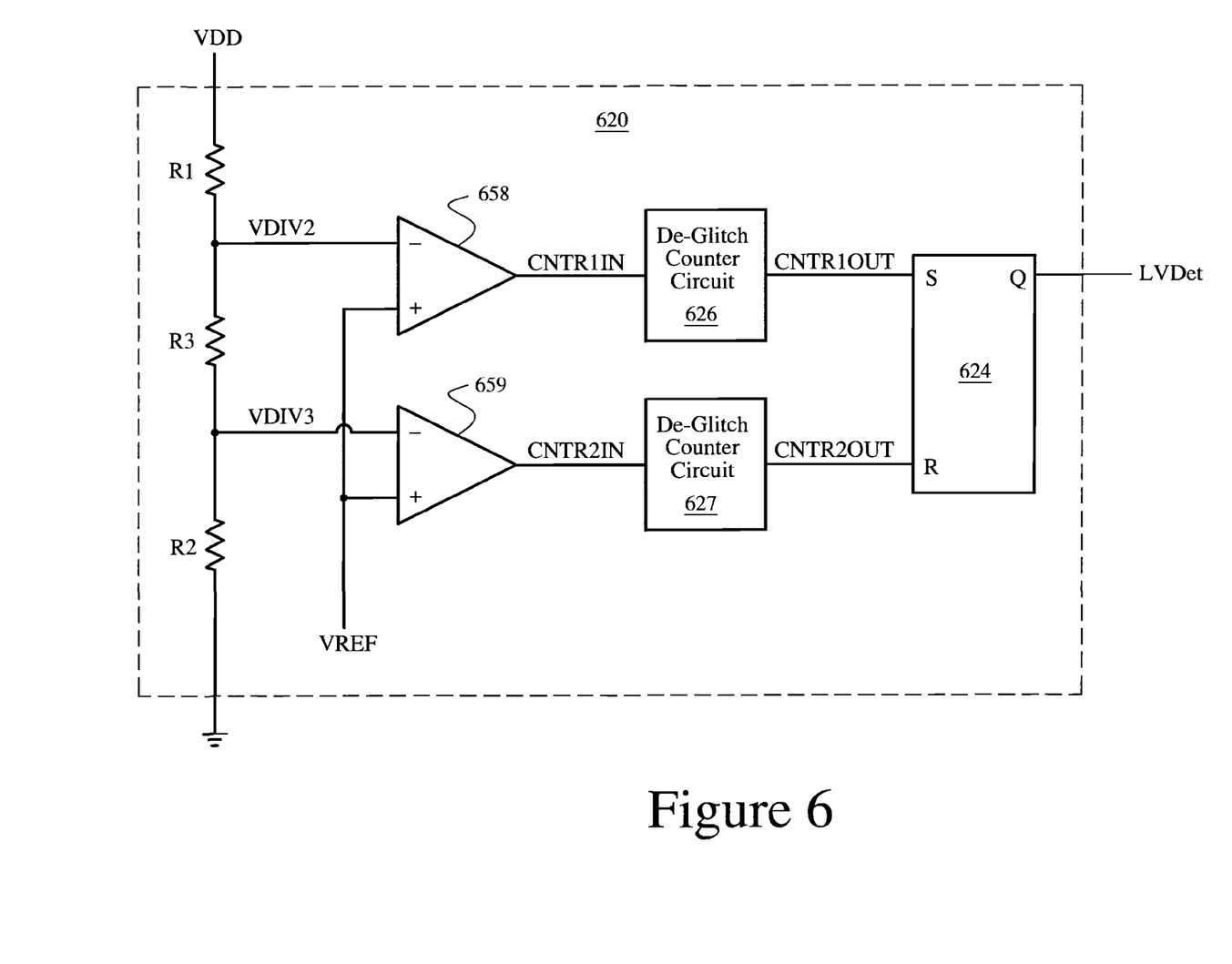
FIG. 6 illustrates a block diagram of an embodiment of the low-voltage detect circuit of FIG. 1 in which hysteresis and de-glitching are implemented.

FIG. 6 illustrates a block diagram of an embodiment of low-voltage detect circuit 620. Low-voltage detect circuit 620 may be employed as an embodiment of low-voltage detect circuit 120 of FIG. 1. Low-voltage detect circuit 620 may include resistors R1–R3; comparators 658 and 659; de-glitch counter circuits 626 and 627; and SR latch 624.

Resistors R1–R3 may be arranged as a voltage divider to provide divider voltages VDIV2 and VDIV3 from supply voltage VDD. Also, comparator 658 may be arranged to compare voltage VDIV2 to reference voltage VREF, and to provide signal CNTR1IN based on the comparison. Similarly, comparator 659 may be arranged to compare voltage VDIV3 to reference voltage VREF, and to provide signal CNTR2IN based on the comparison. The three resistors R1–R3 and two comparators 658 and 659 may be employed to implement hysteresis. For example, 100–300 mV of hysteresis may be employed.

De-glitch counter circuits 626 and 627 may be arranged to provide de-glitch counting. De-glitch counter 626 may be arranged such that the logic level of signal CNTR1OUT is changed if the logic level of signal CNTR1IN changes and remains changed for a delay period. Similarly, de-glitch counter 627 may be arranged such that the logic level of signal CNTR2OUT is changed if the logic level of signal CNTR2IN changes and remains changed for a delay period. For example, the delay period may be approximately 10 to 20 milliseconds.

Additionally, SR latch 624 may be arranged to provide signal LVDet from signal CNTR1OUT and signal CNTR2OUT.

Figure 7:
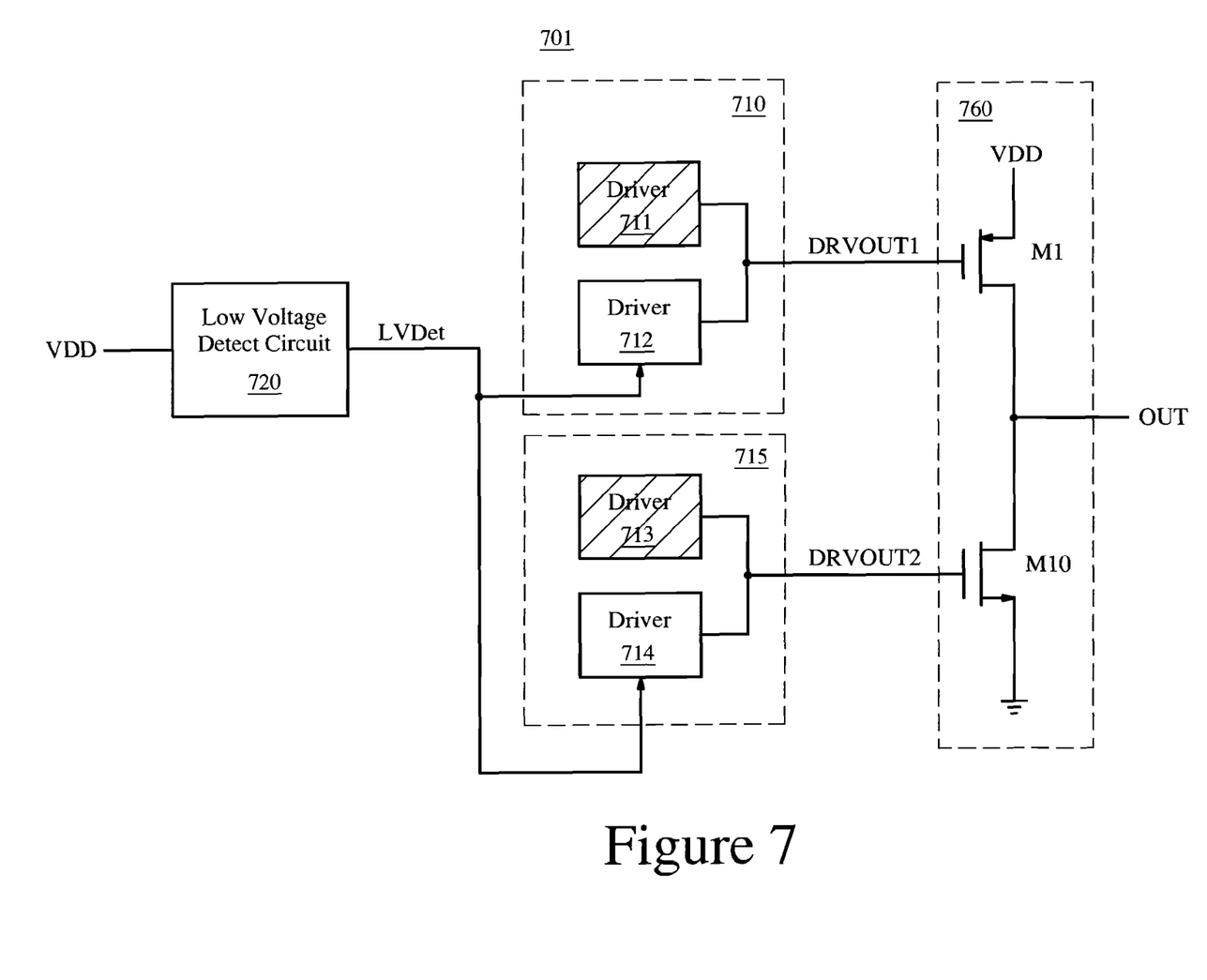
FIG. 7 shows a block diagram of an embodiment of the circuit of FIG. 1 that includes a class D output stage.

FIG. 7 shows a block diagram of an embodiment of circuit 701, which may be employed as an embodiment of circuit 101 of FIG. 1. Circuit 701 further includes driver circuit 715 and power transistor M10. Components in circuit 701 may operate in a similar manner to similarly-named components in circuit 101 of FIG. 1 and driver circuit 410 of FIG. 4, and may operate in a different manner in some ways. Power transistors M1 and M10 are arranged as class D output stage 760. Driver circuit 710 includes drivers 711 and 712. Driver circuit 715 includes drivers 713 and 714.

Driver 711 has an output that is coupled to an output of driver 712 to provide driver output signal DRVOUT1, and driver 713 has an output that is coupled to an output of driver 714 to provide driver output signal DRVOUT2. Additionally, drivers 712 and 714 are each arranged to be enabled if signal LVDet is asserted, and to be disabled if signal LVDet is not asserted. Power transistor M1 is arranged to operate as a high-side switch responsive to signal DRVOUT1, and power transistor M10 is arranged to operate as a low-side switch responsive to signal DRVOUT2.

The input signals to driver circuits 710 and 715 are not shown in FIG. 7. In one embodiment, the input signals to driver circuits 710 and 715 are provided by a quantizer circuit, such as quantizer circuit 338 of FIG. 3. In another embodiment, the input signal to driver circuits 710 and 715 are provided by a pulse width modulation circuit, or the like.

Figure 8:
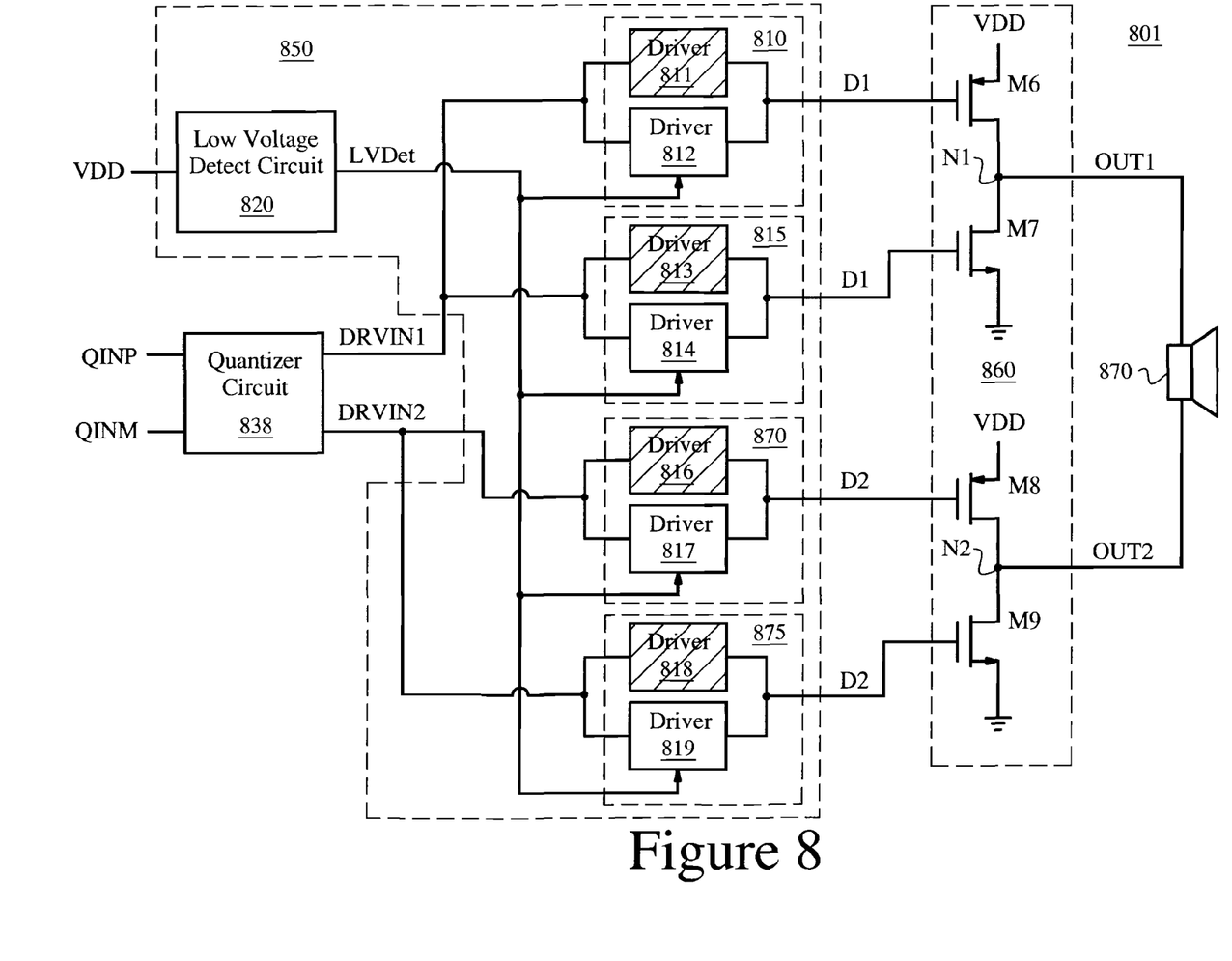
FIG. 8 illustrates a block diagram of an embodiment of a portion of the class D amplifier of FIG. 2, arranged in accordance with aspects of the present invention.

FIG. 8 illustrates a block diagram of an embodiment of circuit 801, which includes an embodiment of a portion of class D amplifier 200 of FIG. 2. Circuit 801 may be employed as an embodiment of circuit 101 of FIG. 1. Circuit 801 includes quantizer circuit 838, power transistor driving circuit 850, class D output stage 860, and speaker 870. Components in FIG. 8 may operate in a similar manner to similarly-named components described with reference to other figures above, and may operate in a different manner in some ways.

In the embodiment shown, quantizer circuit 838 is arranged to provide signal SO so that signal SO includes driver input signals DRVIN1 and DRVIN2.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for driving for a class D audio power amplifier, comprising:
    a low-voltage detect circuit that is arranged to monitor a supply voltage to detect a low supply voltage condition; and further arranged to provide a low-voltage detect signal based, in part, on the monitoring of the supply voltage; and
    a driver circuit that is arranged to drive a power transistor based, in part, on the supply voltage; and further arranged to adaptively adjust a drive strength of the driver circuit based on the low-voltage detect signal such that the drive strength is increased if the low supply voltage condition is detected, wherein the low-voltage detect circuit is arranged to assert the low-voltage detect signal substantially if the supply voltage is below a first pre-determined voltage level, the driver circuit is arranged to increase the drive strength if the low-voltage detect signal is asserted, and wherein the driver circuit includes:
        a first driver including an input and an output; and
        a second driver including an input that is coupled to the input of the first driver, an output that is coupled to the output of the first driver, and an enable input that is coupled to the low-voltage detect circuit, wherein the second driver is arranged to be enabled if the low-voltage detect signal is asserted, and further arranged to be disabled if the low-voltage detect signal is unasserted.

2. The circuit of claim 1, wherein the low-voltage detect circuit is further arranged to assert another low-voltage detect signal substantially if the supply voltage is below a second voltage level; and wherein the driver circuit is further arranged to increase the drive strength if the other low-voltage detect signal is asserted.

3. The circuit of claim 1, wherein the first pre-determined voltage level is approximately 3.4 volts.

4. A circuit for driving for a class D audio power amplifier, comprising:
   a low-voltage detect circuit including a first comparator, wherein the low-voltage detect circuit is arranged to assert a low-voltage detect signal substantially if a supply voltage is below a first pre-determined voltage level; and
   a first driver circuit including:
      a first driver including an input and an output; and
      a second driver including an input that is coupled to the input of the first driver, an output that is coupled to the output of the first driver, and an enable input that is coupled to the low-voltage detect circuit, wherein the second driver is arranged to be enabled if the low-voltage detect signal is asserted, and further arranged to be disabled if the low-voltage detect signal is unasserted.

5. The circuit of claim 4, further comprising:
   a power transistor including a gate that is coupled to the outputs of the first and second drivers.

6. The circuit of claim 4, wherein the comparator is arranged to compare a comparison voltage that is based, at least in part, on the supply voltage with a reference voltage; and to provide the low-voltage detect signal based on the comparison.

7. The circuit of claim 4, further comprising:
   a second driver circuit, including:
      a third driver including an input and an output; and
      a fourth driver including an input that is coupled to the input of the third driver, an output that is coupled to the output of the third driver, and another enable input that is coupled to the low-voltage detect circuit, wherein the fourth driver is arranged to be enabled if the low-voltage detect signal is asserted, and further arranged to be disabled if the low-voltage detect signal is unasserted.

8. The circuit of claim 7, further comprising:
   a class D output stage including a high-side transistor and a low-side transistor, wherein the high-side transistor includes a gate that is coupled to the outputs of the first and second drivers, and wherein the low-side transistor includes a gate that is coupled to the outputs of the third and fourth drivers.

9. The circuit of claim 4, wherein the low-voltage detect circuit includes a de-glitch counter.

10. The circuit of claim 9, wherein the de-glitch counter is configured such that a change in the low-voltage detect level is based on de-glitch counting with approximately 10–20 milliseconds of delay.

11. The circuit of claim 4, wherein the low-voltage detect circuit is arranged to provide hysteresis.

12. The circuit of claim 11, wherein the low-voltage detect circuit includes approximately 100–300 millivolts of hysteresis.

13. The circuit of claim 11, wherein the low-voltage detect circuit further includes:
   a voltage divider that is arranged to divide the supply voltage, wherein the voltage divider includes three resistors arranged to provide first and second divided voltages from the supply voltage, the first comparator is arranged to compare the first divided voltage with a reference voltage, and wherein the first comparator includes an output;
   a second comparator that is arranged to compare the second divided voltage with the reference voltage, wherein the second comparator includes an output;
   a first de-glitch counter including an input that is coupled to the output of the first comparator, and further including an output;
   a second de-glitch counter including an input that is coupled to the output of the second comparator, and further including an output; and
   an S-R latch including a reset input that is coupled the output of the first de-glitch counter, a set input that is coupled to the output of the second de-glitch counter, and a Q output that is arranged to provide the low-voltage detect signal.

14. A method for driving for a class D power audio amplifier, comprising:
   employing a driver circuit to drive a power transistor based, in part, on a supply voltage;
   monitoring the supply voltage; and
   if a low supply voltage condition is detected, increasing a drive strength of the driver circuit; if the low-voltage detect condition is detected based on the monitoring of the supply voltage, asserting a low-voltage detect signal, wherein the drive strength is increased if the low-voltage detect signal is asserted, wherein the driver circuit includes:
      a first driver including an input and an output; and
      a second driver including an input that is coupled to the input of the first driver, and an output that is coupled to the output of the first driver, wherein increasing the drive strength of the driver circuit includes enabling the second driver, and wherein the method further comprises disabling the second driver if the low-voltage detect signal is unasserted.

15. The method of claim 14, wherein monitoring the supply voltage includes:
   providing a comparison voltage that is based, at least in part, on the supply voltage;
   comparing the comparison voltage with a reference voltage; and
   asserting the low-voltage detect signal if the comparison voltage is less than the reference voltage.

16. The method of claim 14, wherein monitoring the supply voltage includes:
   determining substantially whether the supply voltage is below a first pre-determined voltage level, wherein the determination employs at least one of hysteresis and de-glitch counting;
   based on the determination, asserting the low-voltage detect signal if the supply voltage is below the first pre-determined voltage level; and
   based on the determination, unasserting the low-voltage detect signal if the supply voltage is above the first pre-determined voltage level.

* * * * *

UNITED STATES PATENT AND TRADEMARK OFFICE
CERTIFICATE OF CORRECTION

| | |
|---|---|
| PATENT NO. | : 7,227,390 B1 |
| APPLICATION NO. | : 11/043797 |
| DATED | : June 5, 2007 |
| INVENTOR(S) | : Bapat et al. |

It is certified that error appears in the above-identified patent and that said Letters Patent is hereby corrected as shown below:

In column 1, lines 19-20, after "(e.g." delete "500 W–300 W" and insert -- 500W–300W --, therefor.

In column 5, line 35, after "voltage" delete "divider" and insert -- divided --, therefor.

In column 8, line 15, in Claim 13, after "coupled" insert -- to --.

Signed and Sealed this

Seventh Day of August, 2007

JON W. DUDAS
*Director of the United States Patent and Trademark Office*